United States Patent
Kanbe

(10) Patent No.: US 7,348,614 B2
(45) Date of Patent: Mar. 25, 2008

(54) SOLID-STATE IMAGING DEVICE, PRODUCTION METHOD AND DRIVE METHOD THEREOF, AND CAMERA

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 54 days.

(21) Appl. No.: 11/179,963

(22) Filed: Jul. 12, 2005

(65) Prior Publication Data

US 2006/0022235 A1 Feb. 2, 2006

(30) Foreign Application Priority Data

Jul. 29, 2004 (JP) .......................... P2004-221981

(51) Int. Cl.
*H01L 31/062* (2006.01)
*H01L 31/113* (2006.01)

(52) U.S. Cl. ............................. 257/292; 257/E27.133

(58) Field of Classification Search .................... None
See application file for complete search history.

(56) References Cited

U.S. PATENT DOCUMENTS

| | | | |
|---|---|---|---|
| 5,506,429 A * | 4/1996 | Tanaka et al. | 257/233 |
| 5,661,317 A * | 8/1997 | Jeong | 257/225 |
| 5,731,601 A * | 3/1998 | Shioyama et al. | 257/233 |
| 5,834,801 A * | 11/1998 | Jeong | 257/232 |
| 5,912,482 A | 6/1999 | Morimoto | |
| 6,724,062 B2 * | 4/2004 | Akahori et al. | 257/448 |
| 6,867,438 B1 * | 3/2005 | Maruyama et al. | 257/184 |
| 2002/0024066 A1 | 2/2002 | Ide | |

FOREIGN PATENT DOCUMENTS

| | | |
|---|---|---|
| EP | 0 495 503 | 7/1992 |
| EP | 1 014 700 | 12/1999 |
| JP | 2001-352050 | 12/2001 |

OTHER PUBLICATIONS

European Search Report dated Aug. 21, 2006.

* cited by examiner

*Primary Examiner*—Evan Pert
*Assistant Examiner*—Ben P Sandvik
(74) *Attorney, Agent, or Firm*—Sonnenschein Nath & Rosenthal LLP

(57) ABSTRACT

A solid-state imaging device capable of reducing an eclipse (blocking) of an incident light at a circumferential portion of a light receiving portion and realizing a larger angle of view and high-speed driving. A single-layer transfer electrode configuration of forming first transfer electrodes and second transfer electrodes by one polysilicon layer is adopted. Two shunt wirings extending in a horizontal direction are formed on the first transfer electrodes connected in a horizontal direction and, for example, four-phase transfer pulses are supplied to first transfer electrodes and second transfer electrodes on transfer channels through low-resistance shunt wirings extending in the horizontal direction.

7 Claims, 8 Drawing Sheets

SOLID-STATE IMAGING DEVICE, PRODUCTION METHOD AND DRIVE METHOD THEREOF, AND CAMERA

CROSS REFERENCES TO RELATED APPLICATIONS

The present invention contains subject matter related to Japanese Patent Application JP 2004-221981 filed in the Japanese Patent Office on Jul. 29, 2004, the entire contents of which being incorporated herein by reference.

BACKGROUND OF THE INVENTION

1. Field of the Invention

The present invention relates to a camera, a solid-state imaging device used therefor such as a charge coupled device (CCD) type solid-state imaging device, and a method thereof.

2. Description of the Related Art

To achieve a larger angle of view and transfer at a high-speed rate of a CCD solid-state imaging device, there are demanded a lowering a resistance of transfer electrode. It is because such the transfer electrode is generally composed as a distributed constant circuit of an RC, and a high resistance of the transfer electrode will result in non-sharpness (dulling) and delay of a transfer pulse applied by the transfer electrode to disturb a transfer of CCD charges. Then, transfer electrodes and wiring bus lines have been made to be low resistance.

A technique of attaining a low-resistance transfer electrode is that, for example, when the transfer electrode is composed of polysilicon, an impurity is introduced to polysilicon to make the resistance low. Alternately, the polysilicon is made to be a thick film to obtain a low-resistance sheet. In those cases, it is expected an improvement up to only several tens of percentage both in the thickness and the resistance.

As another method of attaining a low-resistance transfer electrode, there is also known a method of using material having a low resistance for the transfer electrode instead of polysilicon. As the material to be used, tungsten silicide (WSi) is well known. In the case used WSi, the resistance is expected to become lower by about one digit.

For the case where the resistance has to be lowered by more than one digit, there has been proposed a configuration of forming a transfer electrode of the CCD itself by polysilicon and using material having a lower resistance than that of above explained WSi, such as aluminum, as a shunt wiring (for example, refer to the following publications: Japanese Patent No. 3123068, Japanese Unexamined Patent Publication No. 7-283387, Japanese Unexamined Patent Publication No. 7-226496, Japanese Unexamined Patent Publication No. 8-236743, and Japanese Unexamined Patent Publication No. 2003-60819).

Actually, most of the techniques so far have applied a method of providing a shunt wiring along a vertical transfer CCD. Such the shunt wiring in the vertical direction suffers from the disadvantages that the transfer mode is limited and multi-phase driving used for interleaving transfer of pixels is hard to be realized.

Furthermore, a configuration of connecting transfer electrodes made by polysilicon over several pixels in the crossing direction becomes also necessary. Although a sufficient thickness of polysilicon has to be secured and the polysilicon itself has to have a low resistance, for example, for performing high-speed driving, work of making pixels finer has a trade-off relationship with work of making the polysilicon film thicker. It is because when the polysilicon film becomes thicker, a height of light shading mask to be formed thereon becomes high, so that eclipse of light (meaning that a light to be irradiated on pixels is blocked by a light shading mask) becomes large when pixels become finer.

A CCD solid-state imaging device with finer pixels has been developed besides realization of a larger angle of view thereof, and a size of one pixel has become 2 µm or so nowadays. Although there are various challenges in realizing finer pixels, to maintain and improve sensitive characteristics is the most significant one.

In this case, since an aperture area of a light receiving portion is reduced due to the miniaturization of pixels, it is required the configuration of an upper layer portion of pixels, such as an on-chip lens, has to be optimized to improve the focusing property. However, an incident light to the light receiving portion is blocked by the transfer electrode itself, so that there has been a proposal of reducing a thickness and projections of the transfer electrode.

As a proposal for reducing the projections, instead of the vertical CCD configuration of forming a transfer electrode by two or three layers of polysilicon, a single-layer transfer electrode configuration of forming the same by one polisilicon layer has been proposed (for example, refer to Japanese Unexamined Patent Publication No. 2003-60819).

However, the circumstances are that a CCD with a larger angle of view and a CCD with high-speed transfer, etc. are actually hard to be realized only by the well-known single-layer transfer electrode configuration, and an eclipse of an incident light cannot be sufficiently reduced.

SUMMARY OF THE INVENTION

It is desired to provide a solid-state imaging device for reducing blocking of an incident light at a circumferential portion of a light receiving portion and attaining a larger angle of view and high-speed driving.

According to the present invention, there is provided a solid-state imaging device, including a plurality of light receiving portions arranged in a first direction and a second direction perpendicular to the first direction; a plurality of transfer channels extending in the second direction, each being arranged between the neighboring light receiving portions; a plurality of first transfer electrodes arranged on the transfer channels, the neighboring first transfer electrodes positioned at both sides of the light receiving portion being connected in the first direction; a plurality of second transfer electrodes arranged in the same layer of the first transfer electrodes, on the transfer channel; and low-resistance wirings of which the number corresponds to the number of transfer electrodes, extending over the first transfer electrode in the first direction, and having a lower resistance than those of the first transfer electrodes and the second transfer electrodes, each of the low-resistance wirings being connected to the first transfer electrode and the second transfer electrode on each transfer channel through a connecting portion.

In the solid-state imaging device of the present invention as above, a transfer pulse can be transferred to the first transfer electrodes and the second transfer electrodes on the transfer channels via low-resistance wirings, so that non-sharpness (dulling) and delay of the transfer pulse can be prevented.

Also, the transfer pulse can be transmitted via the low-resistance wiring, a film thickness of the first transfer electrode and the second transfer electrode can be made thin.

Consequently, heights of the first transfer electrode, the second transfer electrode and low-resistance wiring at the circumferential portion of the light receiving portion can be made low.

According to the solid-state imaging device of the present invention, it is possible to reduce an eclipse (blocking) of an incident light at the circumferential portion of the light receiving portions, and a larger angle of view and high-speed driving can be achieved.

Preferably, the solid-state imaging device may include a light shading mask arranged on the first transfer electrodes, the second transfer electrodes and the low-resistance wirings in a state of interpolating an insulation film, the light shading mask forming a plurality of openings for the light receiving portions.

According to the present invention, there is provided the solid-state imaging device, including the steps of: forming the plurality of light receiving portions in the first direction and the second direction; forming the transfer channels extending in the second direction arranging each of the transfer channel between the neighboring light receiving portions; and forming the first transfer electrodes on the transfer channels, the neighboring first channels positioned at both sides of the light receiving portion being connected in the first direction, and forming the second transfer electrodes on the transfer channels in the same layer of the first transfer electrodes.

According to the present invention, there is provided driving method of the solid-state imaging device, for driving by four-phase driving the solid-state imaging device.

Preferably, the solid-state imaging device may include third transfer electrodes arranged on the same layer of the first transfer electrodes and the second transfer electrodes, on the transfer channels in the first direction; three low-resistance wirings being arranged by extending over the first transfer electrodes in the first direction, and each of the three low-resistance wirings being connected to the first transfer electrodes, the second transfer electrodes and third transfer electrodes on the transfer channels by a connecting portion.

There is provided a method of producing the solid-state imaging device further including a step of forming third transfer electrodes on the transfer channels, in a layer formed by the same steps of forming the first transfer electrodes and the second transfer electrodes.

According to the present invention, there is provided a driving method of the solid-state imaging device, for driving by a three-phase driving or a six-phase driving a solid-state imaging device.

According to the present invention, there is provided a camera, including: an optical lens; and the solid-state imaging device for converting an image obtained through the optical lens to an electric signal.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, preferred embodiments of a camera and a solid-state imaging device used therefor and a method of producing the same of the present invention will be explained with reference to the drawings.

First Embodiment

Figure 1:
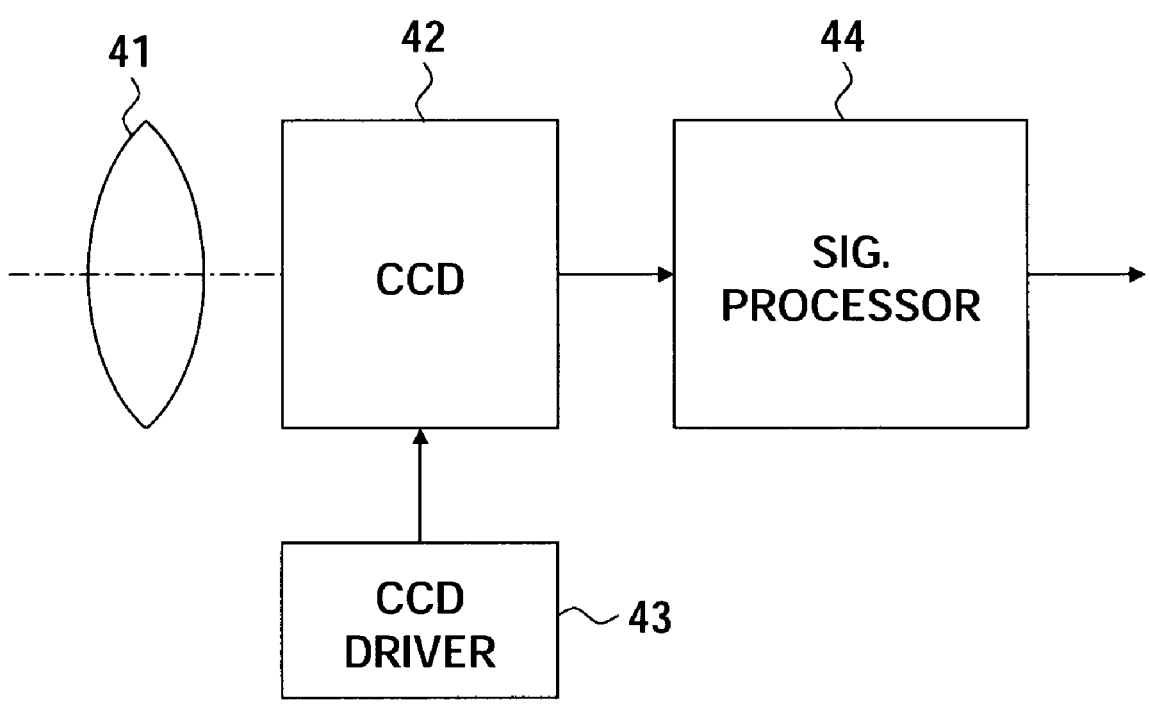
FIG. 1 is a view of the basic configuration of a camera according to an embodiment of the present invention.

FIG. 1 is a schematic view of a camera of an embodiment of the present invention.

The camera shown in FIG. 1 includes an optical lens system 41, a charge-coupled device (CCD) 42, a CCD driver 43 and a signal processor 44.

The optical lens system 41 may include an objective lens, and an automatic-focusing and/or automatic exposure adjusting lens and mechanism. In the embodiment, the optical lens system 41 may include a shutter and a stop. The optical lens system 41 receives a light of an image and outputs the same to the CCD 42 to be focused thereat.

The CCD 42 and the CCD driver 43 cooperate to convert the incident light to the CCD 42 to an electric signal.

The signal processor 44 receives the converted electric signal indicating the image and carries out the image processing to recover the image, for example. Details of the CCD 42 and CCD driver 43 will be described.

As an example of the CCD 42 shown in FIG. 1, a four-phase driving operation is performed by cooperation of the CCD 42 and the CCD driver 43, which will be explained later on. A four-phase driving CCD will be explained as an example in the present embodiment.

Figure 2:
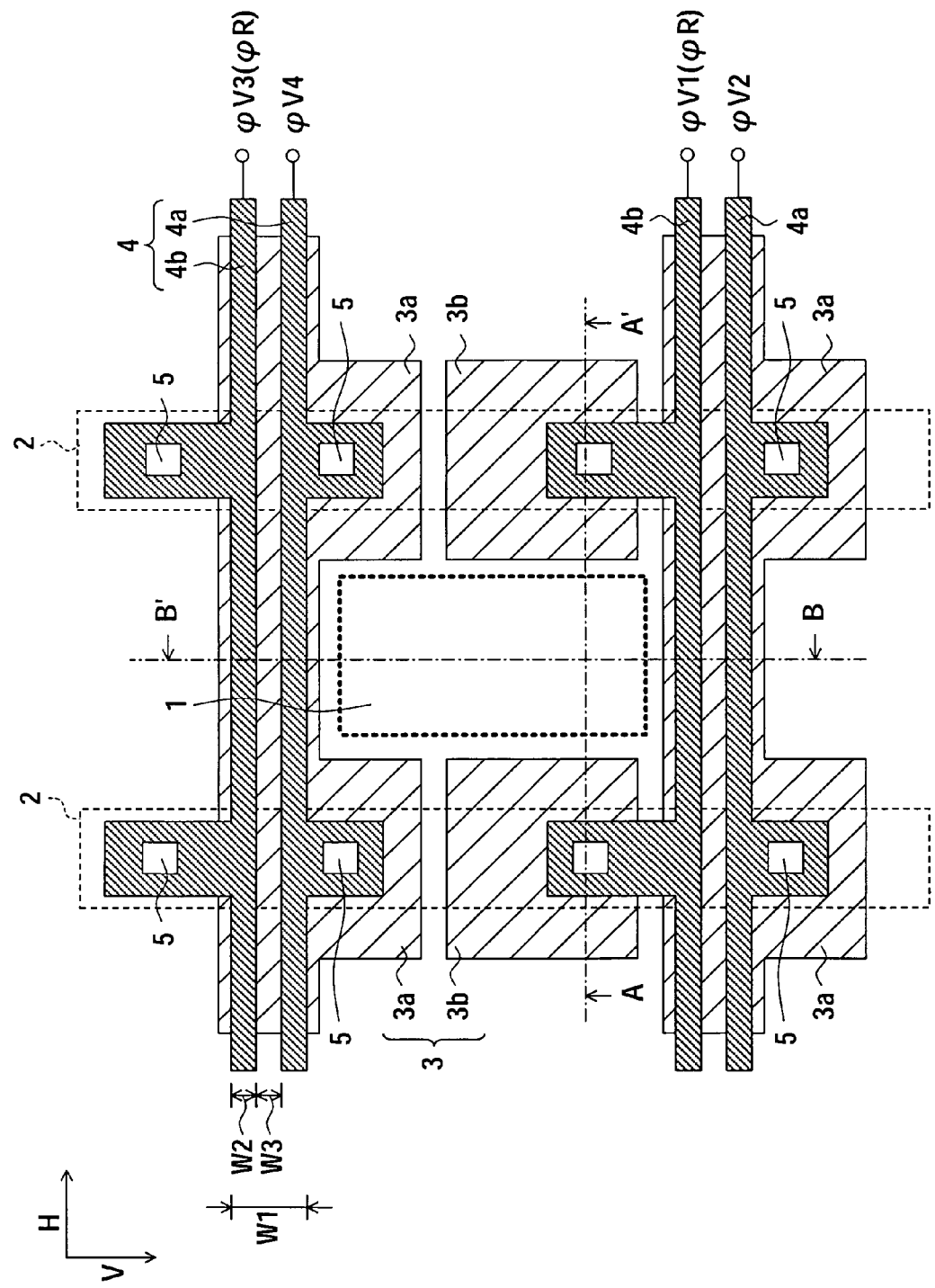
FIG. 2 is a plan view of a key part of a pixel portion in a solid-state imaging device according to a first embodiment.

FIG. 2 is a plan view of a main portion of a pixel portion of a solid-state imaging device, as an example of the CCD 42 in FIG. 1, according to the present embodiment. In the present embodiment, a four-phase driving CCD will be explained as an example. The CCD 42 and the CCD driver 43 cooperate to perform the four-phase drive operation, described later.

In the pixel portion, light receiving portions 1 composing a pixel are arranged. A plurality of the light receiving portions are arranged in a horizontal direction H and in a vertical direction V, not illustrated. The light receiving portion 1 is composed of a photodiode, generates a signal charge in accordance with an incident light quantity and accumulates for a certain period.

Transfer channels 2 extending in the vertical direction are arranged adjacent to the light receiving portions in the horizontal direction. The transfer channel 2 is provided to extend between light receiving portions 1 arranged in the horizontal direction. The transfer channel 2 generates a distributed potential for transferring signal charges in the vertical direction V.

A transfer electrode 3 is arranged on the transfer channel 2 extending in the vertical direction V. The transfer electrode 3 is divided into a first transfer electrode 3a and a second transfer electrode 3b in the view of a layout shape. Note that when it is not necessary to separate the first transfer electrode 3a from second transfer electrode 3b, they are simply referred to as the transfer electrode 3. In the present embodiment, a single-layer transfer electrode configuration is applied, wherein the first transfer electrode 3a and the second transfer electrode 3b are formed in the same layer. The transfer layer 3 is formed, for example, by polysilicon. It is preferable that the transfer electrode 3 has a thin film thickness of, for example, 200 nm or thinner to prevent an eclipse of the incident light.

The above first transfer electrode 3a and the second transfer electrode 3b are alternately and repeatedly arranged in the vertical direction in the transfer channel 2. The transfer electrodes 3 and the transfer channels 2 explained above compose a so-called vertical transfer portion arranged in common for each line of the light receiving portions 1 arranged in the vertical direction.

The first transfer electrodes 3a are connected in the horizontal direction H by extending between light receiving portions 1 arranged in the vertical direction. When composing a pixel of 2 μm×2 μm or so, a width W1 of a part of the first transfer electrode 3a between the light receiving portions 1 is 0.45 μm or so.

Each second transfer electrode 3b is isolated on the transfer channel 2, that is, separated and not connected in the horizontal direction H. The second transfer electrodes 3b are arranged adjacent to the light receiving portion 1.

Two shunt wirings 4 extending in the horizontal direction H are arranged in the first transfer electrode 3a over an insulation film. The shunt wirings 4 are formed by tungsten having a lower resistance than that of polysilicon forming the transfer electrode 3. The shunt wirings 4 correspond to the low-resistance wirings of the present invention. The number of the shunt wirings 4 corresponds to the number of the transfer electrodes arranged for one light receiving portion 1 and is two in the present embodiment. A width W2 of one shunt wiring is, for example, 0.12 μm, and a width W3 between the two shunt wirings is, for example, 0.16 μm. The shunt wirings 4 are divided into shunt wirings 4a and shunt wirings 4b depending on a destination of the connection. Note that when it is not necessary to separate the shunt wiring 4a from the shunt wiring 4b, it will be simply referred to as a shunt wiring 4.

The shunt wiring 4a is connected to the first transfer electrodes 3a by connecting portions 5 on the transfer channel 2. The shunt wiring 4b is connected to the second transfer electrodes 3b by connecting portions 5 on the transfer channel 2.

The first transfer electrodes 3a and the second transfer electrodes 3b alternately and repeatedly arranged on the transfer channel 2 in the vertical direction V are supplied with transfer pulses of four phases having different phases øV1, øV2, øV3 and øV4 along the vertical direction through the shunt wirings 4. The voltage of the transfer pulses øV1 to øV4 are, for example, −7V to 0V.

In addition to the transfer pulses øV1 and øV3, the floating type second transfer electrodes 3b adjacent to the light receiving portion 1 are supplied with a read-out pulse øR for transferring signal charges accumulated in the light receiving portion 1 to the transfer channels 2 through the shunt wirings 4b. The voltage of the read-out pulse øR is, for example +12V to +15V.

Figure 3A:
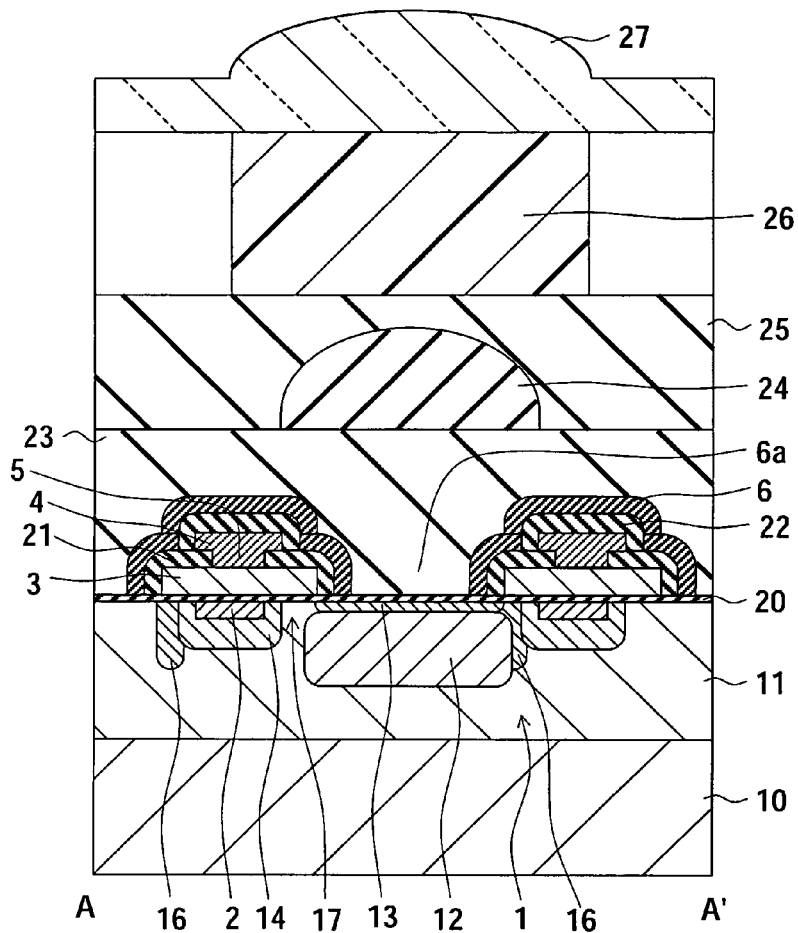
FIG. 3A is a sectional view along a line A-A' in FIG. 2.
Figure 3B:
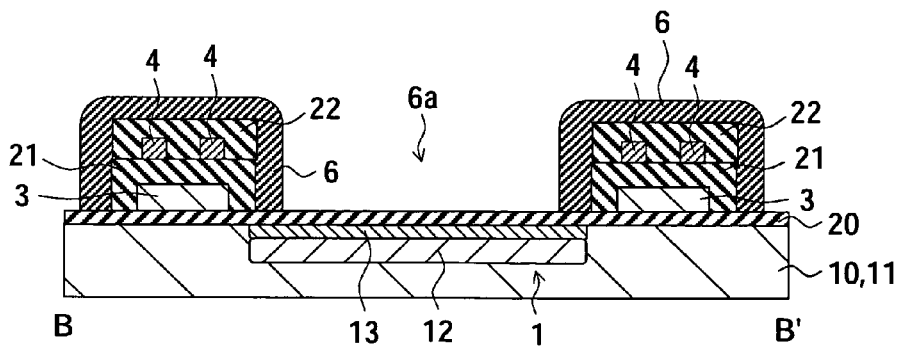
FIG. 3B is a sectional view along a line B-B' in FIG. 2.

FIG. 3A is a sectional view along the line A-A' in FIG. 2, and FIG. 3B is a sectional view along the line B-B' in FIG. 2. Note that the configuration of an upper layer portion above the light shading mask 6 is shown in FIG. 3A, while that is omitted in FIG. 3B for simplifying the drawing.

In the present embodiment, a semiconductor substrate 10, for example, made of n-type silicon is used. In the semiconductor substrate 10, a p-type well 11 is formed. In the p-type well 1, an n-type region 12 is formed, and a p-type region 13 is formed at a position closer to the surface side than the position of the n-type region 12. A photodiode formed by the pn-junction of the n-type region 12 and the p-type well 11 composes the light receiving portion 1. As a result, the p-type region 13 is formed closer to the surface side comparing with the n-type region 12, a buried photodiode having a reduced dark current is formed.

A p-type well 14 is formed adjacent to the n-type region 12, and the transfer channel 2 formed by an n-type region is formed in the p-type well 14. A p-type channel stop portion 16 for preventing flowing of signal charges between adjacent light receiving portions 1 is formed. In the illustrated example, between the light receiving portion 1 and the transfer channel 2 on the left side of the light receiving portion 1 becomes a reading gate portion 17. Accordingly, the transfer electrode 3 controls a potential distribution of the reading gate portion 17, and signal charges of the light receiving portion 1 is read by the transfer channel 2 on the left side.

In the semiconductor substrate 10 formed with a variety of semiconductor regions, transfer electrodes 3 made by polysilicon are formed via a gate insulation film 20. A film thickness of the transfer electrode 3 is, for example, 0.1 μm.

An insulation film 21, for example, made of oxide silicon is formed to cover the transfer electrodes 3. In the transfer electrodes 3, shunt wirings 4, for example, made of tungsten are formed via the insulation film 21. A film thickness of the shunt wirings 4 is, for example, 0.1 μm. The insulation film 21 is formed with apertures at connecting portions 5, and the shunt wirings 4 and the transfer electrodes 3 are connected at the connecting portions 5.

An interlayer insulation film 22, for example, made of oxide silicon is formed to cover the shunt wirings 4. A light shading mask 6 for covering the transfer electrodes 3 and the shunt wirings 4 is formed via the insulation film 21 and the interlayer insulation film 22. The light shading mask 6 is formed with opening portions 6a above the light receiving portions 1.

An interlayer insulation film 23, for example, made of phosphosilicate glass (PSG) or borophosphosilicate glass (BPSG) film is formed to cover allover the light shading mask 6, and thus the surface is flattened.

On the interlayer insulation film 23, an inner-layer lens, for example, made of oxide silicon or nitride silicon is formed, and a flattening film 25 is formed further thereon. The flattening film 25 is, for example, formed of a resin having a high light transmittance to a visible light.

On the flattening film 25, a plurality of kinds of color filters 26 for transmitting lights in predetermined wavelength regions are formed. The color filters 26 are colored to be any of red (R), green (G) and blue (B) as primary colors and, for example, any of yellow (Ye), cyan (Cy), magenta (M) and green (G), etc. as complementary colors.

On the color filters 26, an on-chip lens 27 is formed. The on-chip lens 27 is formed by a light transmitting material, such as a negative photosensitive resin.

Next, an operation of the solid-state imaging device according to the above embodiment will be explained.

An incident light is converged by the on-chip lens 27, and only a light in a predetermined wavelength range transmits because of the color filter 26. The light transmitted through the color filter 26 is further collected by the inner-layer lens 24 and guided to the light receiving portion 1.

When the light of the image, for example, is irradiated to the light receiving portion 1, signal charges (electrons in the present example) in accordance with the incident light quantity are generated by photoelectric conversion and accumulated for a certain period in the n-type region 12 of the light receiving portion 1. When the read-out pulse øR is supplied to the second transfer electrodes 4b (refer to FIG. 2) through the shunt wirings 4b, a potential distribution of the read-out gate portion 17 changes and signal charges in the n-type region 12 are read out to the transfer channel 2.

After the signal charges are read out to the transfer channel 2, the four-phase transfer pulses øV1 to øV4 are supplied to the transfer electrodes 3 arranged in the vertical direction V via the shunt wirings 4. The potential distribution of the transfer channel 2 is controlled by the four-phase transfer pulses øV1 to øV4, and then the signal charges are transferred in the vertical direction V.

While not illustrated, after the signal charges are transferred in the vertical direction V, they are transferred in the horizontal direction by a horizontal transfer portion, converted to a voltage in accordance with a signal charge amount thereof by an outputting portion and output.

Next, a method of producing the solid-state imaging device according to the present embodiment explained above will be explained with reference to sectional views of steps in FIG. 4 to FIG. 7. The sectional views of steps in FIG. 4 to FIG. 7 are sectional views corresponding to FIG. 3A.

Figure 4A:
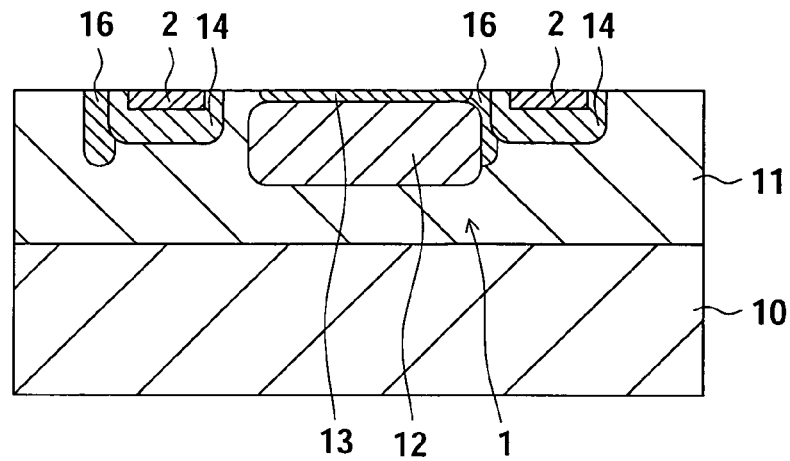
FIG. 4 is a sectional view of a step of producing the solid-state imaging device according to the first embodiment.

As shown in FIG. 4A, in the semiconductor substrate 10 formed by n-type silicon, the p-type well 11, n-type region 12, p-type region 13, n-type transfer channels 2, p-type wells 14 and p-type channel stop portions 16 are formed by the ion implantation method. Note that the ion implantation may be performed in a state where an oxide silicon film, etc. is formed on the semiconductor substrate 10. When forming an oxide silicon film, etc., it is removed after the ion implantation.

Figure 4B:
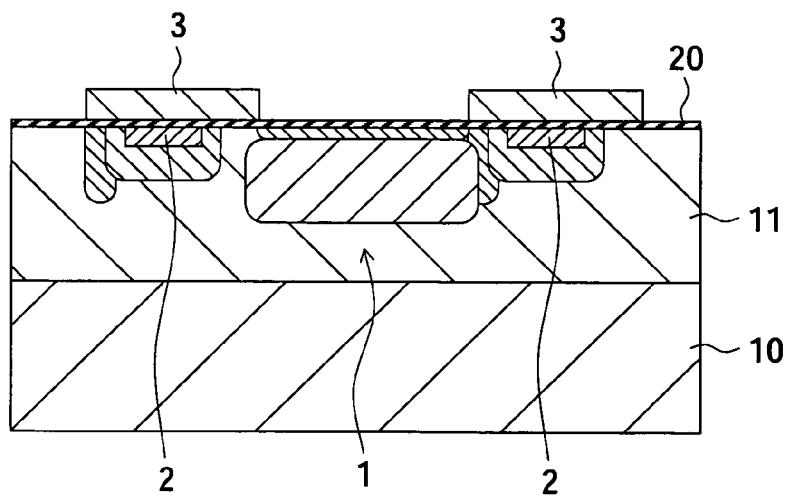

Next, as shown in FIG. 4B, the gate insulation film 20, for example, formed of oxide silicon is formed on the semiconductor substrate 10 by the thermal oxidization method or chemical vapor deposition (CVD) method. Continuously, on the gate insulation film 20, polysilicon is deposited by the CVD method and processed by dry etching, so that the transfer electrodes 3 are formed. Note that a polysilicon film thickness is preferably 200 nm or thinner in the case of a pixel of 2 µm×2 µm to reduce an eclipse of light.

Figure 5A:
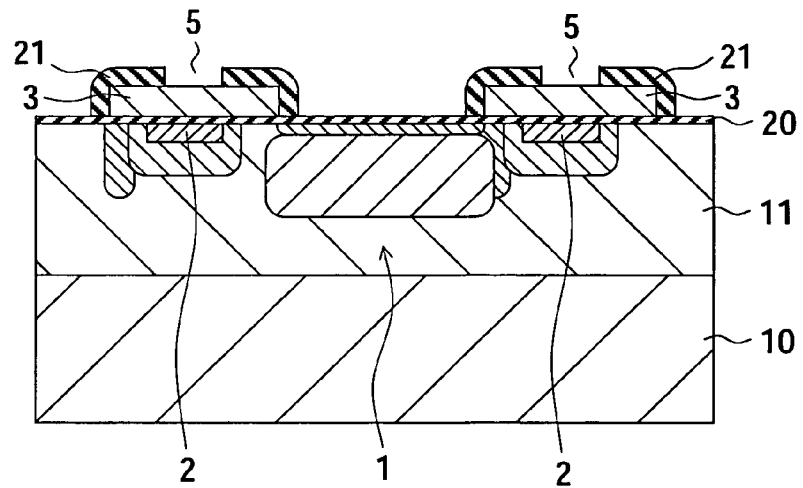
FIG. 5 is a sectional view of a step of producing the solid-state imaging device according to the first embodiment.

Next, as shown in FIG. 5A, the insulation film 21 formed by oxide silicon, etc. for covering the transfer electrodes 3 is formed by the CVD method. Continuously, the insulation film 21 at positions to be connecting portions 5 is removed, so that the transfer electrodes 3 are partially exposed on (or above) the transfer channel 2.

Figure 5B:
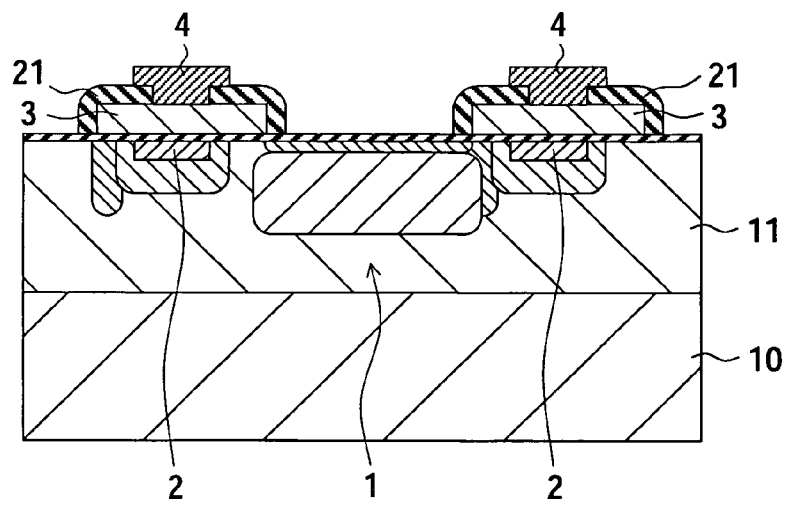

Next, as shown in FIG. 5B, for example, a tungsten film is formed on the insulation films 21 by the sputtering method or CVD method, and the tungsten film is processed by the dry etching, so that shunt wirings 4 are formed.

Figure 6A:
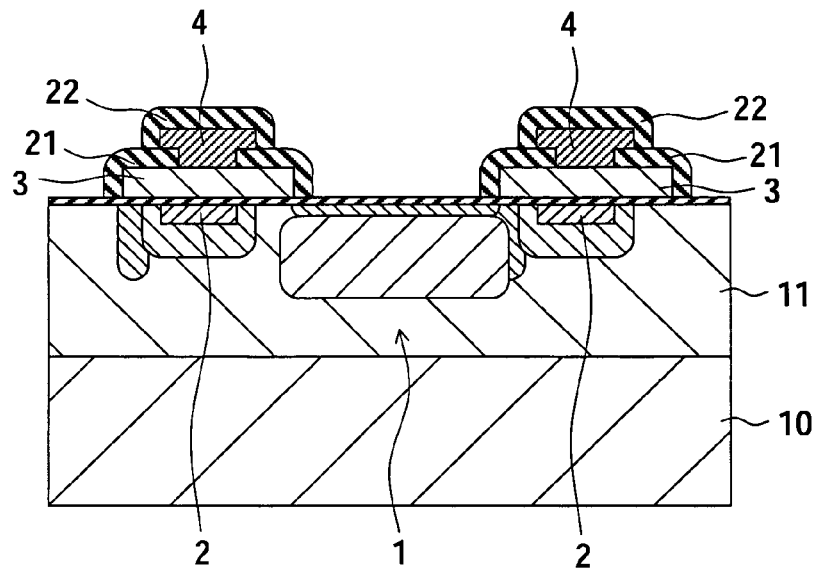
FIG. 6 is a sectional view of a step of producing the solid-state imaging device according to the first embodiment.

Next, as shown in FIG. 6A, oxide silicon films, etc. are deposited by the CVD method, so that interlayer insulation films 22 for covering the transfer electrodes 3 and the shunt wirings 4 are formed.

Figure 6B:
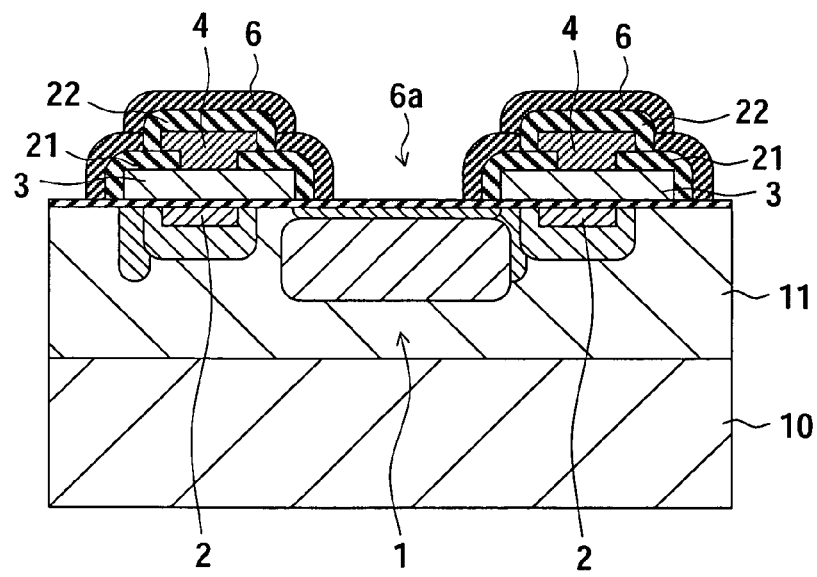

Next, as shown in FIG. 6B, a tungsten film is formed by the sputtering method or CVD method, the tungsten film is processed by the dry etching to cover the transfer electrode 3 and shunt wiring 4, so that the light shading mask 6 having an opening portion 6a on (or above) the light receiving portion 1 is formed.

Figure 7A:
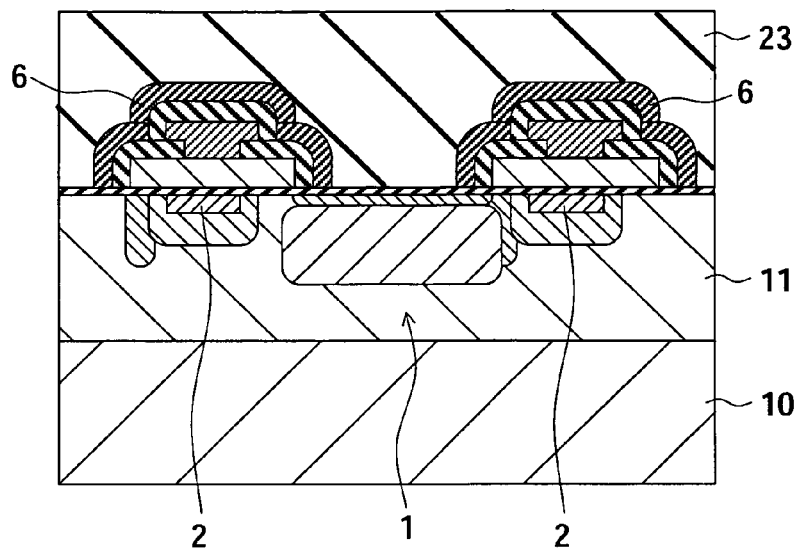
FIG. 7 is a sectional view of a step of producing the solid-state imaging device according to the first embodiment.

Next, as shown in FIG. 7A, a BPSG film or a PSG film is deposited by the CVD method to form the interlayer insulation film 23. After the deposition, by performing reflow processing, a surface of the interlayer insulation film 23 becomes flattened. In the reflow processing, the temperature becomes high as 800° C. or higher, so that it is configured to be resistive to a high temperature by not using aluminum but using tungsten for the shunt wirings 4 and light shading mask 6.

Figure 7B:
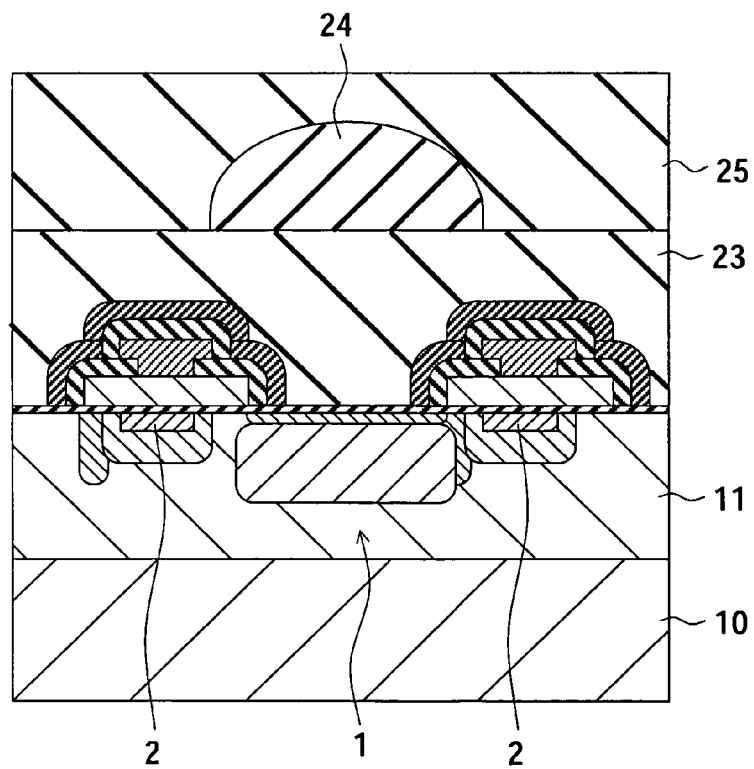

Next, as shown in FIG. 7B, above the light receiving portion 1, the inner-layer lens 24 is formed on the interlayer insulation film 23. For forming the inner-layer lens 24, a light transmitting film of oxide silicon or nitride silicon, etc. is deposited, for example, by the plasma CVD method first, then, a resist film having a convex lens shape is formed by the resist film application, patterning and reflow processing, and finally, by performing etching under a condition that etching selectivity of the resist film and the light transmitting film becomes approximately 1, the inner-layer lens 24 is formed. After forming the inner-layer lens 24, the flattening film 25, for example, made of a resin having a high light transmittance to a visible light is formed.

As the following steps, the color filters are formed, for example, by a staining method. Then, a light transmitting resin, such as a negative photosensitive resin, is deposited on the color filters 26, and etching using as a mask a resist pattern having a convex lens shape is performed in the same way as in the inner-layer lens 24 so as to form the on-chip lens 27. From the above steps, the solid-state imaging device according to the present embodiment is produced.

Next, an effect of the solid-state imaging device according to the present embodiment explained above will be explained.

In the present embodiment, a single-layer transfer electrode configuration of forming the first transfer electrodes 3a and the second transfer electrodes 3b by one polysilicon layer is applied. Then, on the first transfer electrodes 3a connected in the horizontal direction, the two shunt wirings 4a and 4b extending in the horizontal direction are formed and connected to the first transfer electrodes 3a and the second transfer electrodes 3b on the transfer channels 2.

Since the four-phase transfer pulses øV1 to øV4 can be supplied to the first transfer electrodes 3a and the second transfer electrodes 3b on the transfer channels 2 via the low-resistance shunt wirings 4a and 4b extending in the horizontal direction, it is possible to reduce non-sharpness (dulling) and delay of the transfer pulses. As a result, it is possible to realize a larger angle of view and high-speed driving.

Also, since the transfer pulses are supplied to all transfer electrodes 3 of the pixel portion by the shunt wirings 4a and 4b, the transfer electrodes 3 having the single-layer configuration do not have to be far low resistance, so that it may be made thinner comparing with that in the case of the related art. Also, since tungsten composing the shunt wirings 4a and 4b has a lower resistance than that of polysilicon by two order (digits) or so, they can be made thinner. For example, the transfer electrodes 3 and the shunt wirings 4 may be made thin as 200 nm or thinner, respectively. Consequently, a height of the light shading mask 6 covering the transfer electrodes 3 and shunt wirings 4 and surrounding the light receiving portion 1 can be lowered, so that an eclipse of the incident light by the light shading mask 6 can be reduced.

Also, since the shunt wirings 4a and 4b extend in the horizontal direction, the shunt wirings 4a and 4b are connected to all the first transfer electrodes 3a or all the second transfer electrodes 3b arranged in the horizontal direction on the transfer channels 2. Therefore, the transfer mode is not limited and it is possible to respond to interleaving transfer of pixels, etc.

Furthermore, since the first transfer electrodes 3a are provided under the shunt wirings 4a and 4b extending in the horizontal direction, when the read-out pulse øR is supplied to the floating type second transfer electrodes 3b through the shunt wirings 4b, the potential distribution of the semiconductor substrate 10 under the shunt wirings 4b is not affected due to the blocking effect by the first transfer electrodes 3a as the lower layer. Therefore, color mixture phenomenon between light receiving portions 1 arranged in the vertical direction can be prevented.

Second Embodiment

Figure 8:
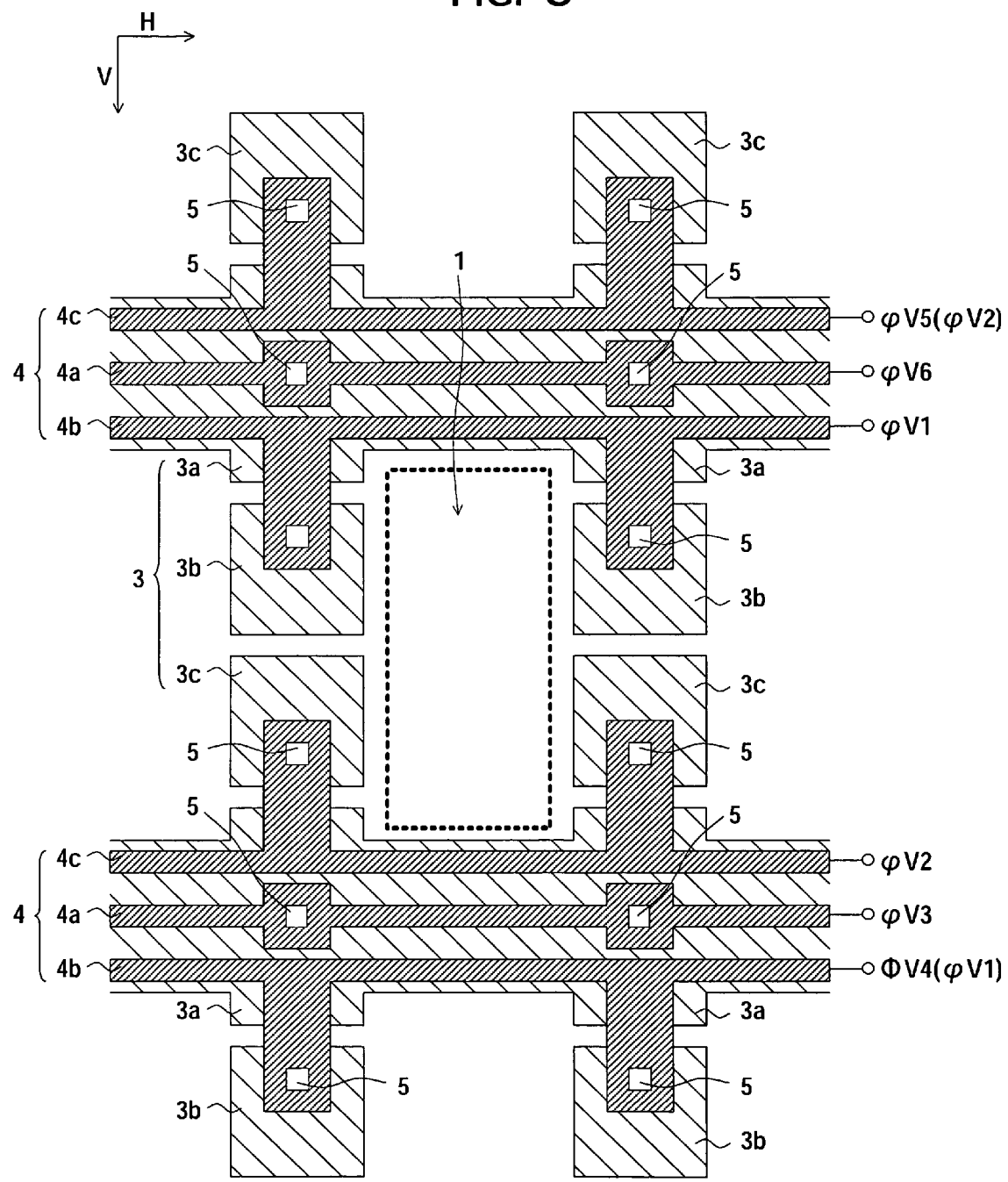
FIG. 8 is a plan view of a key part of a pixel portion in a solid-state imaging device according to a second embodiment.

An example of the four-phase driving CCD was explained in the first embodiment, while in the present embodiment, an example of a six-phase driving or three-phase driving CCD, wherein the CCD 42 and the CCD driver 43 cooperate for performing three-phase driving, will be explained. FIG. 8 is a plan view of a main part of a pixel portion in a solid-state imaging device according to the second embodiment. Note that the same reference numbers are given to the same components as those in FIG. 2 and explanations thereof will be omitted.

In the transfer channel 2 extending in the vertical direction V, the transfer electrodes 3 made by single-layer polysilicon are arranged. In the present embodiment, the transfer electrodes 3 includes third transfer electrodes 3c in addition to the first transfer electrodes 3a and the second transfer electrodes 3b. A film thickness of the transfer electrodes 3 is preferably thin as, for example, 200 nm or thinner to prevent an eclipse of an incident light.

The first transfer electrodes 3a, the second transfer electrodes 3b and the third transfer electrodes 3c are alternately and repeatedly arrange in the vertical direction on the transfer channels 2. The transfer electrodes 3 and the transfer channels 2 compose a so-called vertical transfer portion arranged in common for each line of the light receiving portions 1 arranged in the vertical direction V.

The first transfer electrodes 3a are connected in the horizontal direction H by extending between the light receiving portions 1 arranged in the vertical direction, and each of the second transfer electrode 3b has an isolated shape on the transfer channel 2, that is, it is not connected in the horizontal direction H and has a separated shape, which are the same as those in the first embodiment.

The third transfer electrode 3c also have an isolated shape on the transfer channel 2, that is, not connected in the horizontal direction H and have a separated shape in the same way as the second transfer electrode 3b. The third transfer electrodes 3c are arranged adjacent to the light receiving portion 1.

In the transfer electrodes 3a, three shunt wirings 4 extending in the horizontal direction H are formed via an insulation film. The shunt wirings 4 are formed by tungsten having a lower resistance than that of polysilicon composing the transfer electrodes 3 and correspond to the low-resistance wirings of the present invention. The shunt wirings 4 include three kinds of shunt wirings 4a, 4b and 4c.

The shunt wirings 4a are connected to the first transfer electrodes 3a by connecting portions 5 on the transfer channels 2. The shunt wirings 4b are connected to the second transfer electrodes 3b by connecting portions 5 on the transfer channels 2. The shunt wirings 4c are connected to the third transfer electrodes 3c by connecting portions 5 on the transfer channels 2.

When realizing six-phase driving, six-phase transfer pulses øV1, øV2, øV3, øV4, øV5 and øV6 having different phases are supplied along the vertical direction to the first transfer electrodes 3a, the second transfer electrodes 3b and the third transfer electrodes 3c arranged alternately and repeatedly in the vertical direction V via the shunt wirings 4 on the transfer channels 2. Among them, a read-out pulse øR is supplied to the two transfer electrodes 3b and 3c adjacent to a pixel through the shunt wirings 4b and 4c.

When realizing three-phase driving, the three-phase transfer pulses øV1, øV2 and øV3 having different phases are supplied along the vertical direction to the first transfer electrodes 3a, the second transfer electrodes 3b and the third transfer electrodes 3c are arranged alternately and repeatedly in the vertical direction V via the shunt wirings 4 on the transfer channels 2. Among them, the read-out pulse øR is supplied, for example, to one of third transfer electrode 3c adjacent to a pixel through the shunt wirings 4c.

As explained above, by adding the floating type third transfer electrode 3c and providing the three shunt wirings extending on the first transfer electrodes 3a, the three-phase driving or the six-phase driving of the solid-state imaging device can be realized.

The solid-state imaging device according to the present embodiment has the same effects as those in the first embodiment.

The present invention is not limited to the above explanation on the embodiments.

For example, in the above embodiments, examples of the three-phase driving, four-phase driving and six-phase driving were explained, but two-phase driving may be also achieved. In the case of the two-phase driving, a layout of the transfer electrodes 3 and shunt wirings 4 is the same as that in the first embodiment. The two-phase driving can be realized by changing the transfer pulses ø3 to ø1 and ø4 to ø2, and by giving potential gradient to the transfer channel 2 under the transfer electrodes 3a and 3b. Also, more than six-phase driving may be also realized. In this case, it can be realized only by adding floating type transfer electrodes and increasing the number of shunt wirings.

Furthermore, the solid-state imaging device of the present invention can be also applied to an interline transfer type solid-state imaging device and a frame interline transfer type solid-state imaging device. A variety of modifications of the present invention may be made on the configuration of upper layers of the light shading mask 6. The values and materials, etc, mentioned in the above embodiments are just examples and the present invention is not limited to those.

It should be understood by those skilled in the art that various modifications, combinations, sub-combinations and alternations may occur depending on design requirements and other factors insofar as they are within the scope of the appended claims or the equivalents thereof.

What is claimed is:

1. A solid-state imaging device, comprising:
   a plurality of light receiving portions arranged in a first direction and a second direction perpendicular to the first direction;
   a plurality of transfer channels extending in the second direction, each being positioned between neighboring light receiving portions;
   a plurality of first transfer electrodes positioned over said transfer channels, neighboring first transfer electrodes being connected in the first direction positioned at both sides of each light receiving portion;
   a plurality of second transfer electrodes positioned over on said transfer channels, said first transfer electrodes and said second transfer electrodes being formed in the same layer; and
   low-resistance wirings, the number of which corresponds to the number of transfer electrodes, extending over said first transfer electrodes in the first direction, and having a resistance lower than any of said first transfer electrodes and said second transfer electrodes, each of said low-resistance wirings being connected to the first transfer electrodes and the second transfer electrodes over each of said transfer channels through a connecting portion.

2. A solid-state imaging device as set forth in claim 1, wherein the respective second transfer electrodes over said transfer channels are arranged separately.

3. A solid-state imaging device as set forth in claim 1, wherein said first transfer electrodes are supplied with a read-out voltage for reading signal charges accumulated in said light receiving portions to the transfer channels through said low-resistance wirings.

4. A solid-state imaging device as set forth in claim 1, further comprising a light shading layer arranged over said first transfer electrodes, said second transfer electrodes and said low-resistance wirings in a state of interpolating an insulation film, said light shading layer forming a plurality of openings for said light receiving portions.

5. A solid-state imaging device as set forth in claim 1, further comprising:
   third transfer electrodes positioned over on said transfer channels in the first direction; and
   three low-resistance wirings being arranged by extending over said first transfer electrodes in the first direction, and each of said three low-resistance wirings being connected to said first transfer electrodes, said second transfer electrodes and third transfer electrodes over said transfer channels by a connecting portion.

6. A solid-state imaging device as set forth in claim 5, wherein the respective third transfer electrodes over said transfer channels are positioned separately.

7. A solid-state imaging device as set forth in claim 1, wherein said first transfer electrodes and second transfer electrodes are formed of polysilicon, and said low-resistance wirings are formed of tungsten.

* * * * *